US012176255B2

(12) United States Patent
Abdul Razak et al.

(10) Patent No.: US 12,176,255 B2
(45) Date of Patent: Dec. 24, 2024

(54) CANTILEVERED DIES IN CERAMIC PACKAGES

(71) Applicant: TEXAS INSTRUMENTS INCORPORATED, Dallas, TX (US)

(72) Inventors: Ramlah Binte Abdul Razak, Plano, TX (US); Paul Merle Emerson, Madison, AL (US); Mohammad Hadi Motieian Najar, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 335 days.

(21) Appl. No.: 17/589,405

(22) Filed: Jan. 31, 2022

(65) Prior Publication Data

US 2023/0245935 A1 Aug. 3, 2023

(51) Int. Cl.
*H01L 23/15* (2006.01)
*H01L 23/00* (2006.01)

(52) U.S. Cl.
CPC .............. *H01L 23/15* (2013.01); *H01L 24/05* (2013.01); *H01L 24/32* (2013.01); *H01L 24/45* (2013.01); *H01L 24/73* (2013.01); *H01L 2224/04042* (2013.01); *H01L 2224/05647* (2013.01); *H01L 2224/32225* (2013.01); *H01L 2224/45147* (2013.01); *H01L 2224/73265* (2013.01)

(58) Field of Classification Search
CPC ......... H01L 23/15; H01L 24/05; H01L 24/32; H01L 24/45; H01L 24/73; H01L 2224/04042; H01L 2224/05647; H01L 2224/32225; H01L 2224/45147; H01L 2224/73265; H01L 23/053; H01L 23/10; H01L 23/36; H01L 23/367; H01L 23/66; H01L 23/13; H01L 24/48; H01L 24/49; H01L 24/85; H01L 24/92; H01L 23/4855; H01L 23/49811
See application file for complete search history.

(56) References Cited

U.S. PATENT DOCUMENTS

2016/0061677 A1* 3/2016 Han ..................... G01L 9/0045
438/51
2017/0174509 A1* 6/2017 Dawson ............... B81B 7/0061

* cited by examiner

*Primary Examiner* — Elias Ullah
(74) *Attorney, Agent, or Firm* — Frank D. Cimino (57) ABSTRACT

In some examples, a device comprises a ceramic substrate having a cavity, a die pad in the cavity, and a semiconductor die in the cavity and having a first segment coupled to the die pad and a second segment cantilevered over a floor of the cavity. The device also includes a first conductive member in the cavity, the first conductive member coupled to a second conductive member exposed to an exterior of the ceramic substrate. The device also includes a bond wire coupled to a device side of the semiconductor die and to the first conductive member.

30 Claims, 12 Drawing Sheets

CANTILEVERED DIES IN CERAMIC PACKAGES

BACKGROUND

Precision circuits (e.g., reference voltage supplies) have exacting specifications that require the circuits to operate within a narrow range of parameters. A precision circuit may be covered by a package that protects the circuit from influences, such as thermal fluctuations and mechanical stress, that can cause the circuit to fall outside the narrow range of parameters.

SUMMARY

In some examples, a device comprises a ceramic substrate having a cavity, a die pad in the cavity, and a semiconductor die in the cavity and having a first segment coupled to the die pad and a second segment cantilevered over a floor of the cavity. The device also includes a first conductive member in the cavity, the first conductive member coupled to a second conductive member exposed to an exterior of the ceramic substrate. The device also includes a bond wire coupled to a device side of the semiconductor die and to the first conductive member.

DETAILED DESCRIPTION

As described above, a precision circuit may be covered by a package that protects the circuit from deleterious influences, such as thermal fluctuations and mechanical stress, that can cause the circuit to fail to meet specifications. For example, a reference voltage supply that is to provide a precise reference voltage may be susceptible to thermal fluctuations or mechanical stress that is applied to the reference voltage supply or to the package that contains the reference voltage supply. Because the reference voltage supply in this scenario is a precision circuit, even small voltage swings may be unacceptable. Prior approaches to solving this challenge include metal can packages and thermal islands on printed circuit boards (PCBs) to mitigate the influence of thermal fluctuations and mechanical stress on the semiconductor die in which the precision circuit is formed, but such approaches have proven inadequate. Thermal fluctuations and mechanical stress remain a challenge for precision circuitry.

Described herein are various examples of cantilevered semiconductor dies in ceramic packages. In examples, a ceramic package includes a ceramic substrate having a hermetically sealed cavity. The package includes a die pad in the cavity. The package includes a semiconductor die in the cavity and having a first segment coupled to the die pad and a second segment cantilevered over a floor of the cavity. A circuit, such as a precision circuit, may be formed in a device side of the semiconductor die. The circuit may be on the second segment of the semiconductor die such that the circuit is suspended above the cavity. The dimensions of the semiconductor die, die pad, and cavity are such that the circuit is protected from heat and mechanical stress. In examples, some or all conductive materials in the cavity and in the ceramic substrate are of a uniform metal (e.g., copper) to mitigating thermocouple effects. By protecting the circuit from such deleterious influences, the circuit does not experience thermal fluctuations and mechanical stress to the same degree as would be the case in other implementations.

Accordingly, these factors do not substantially impact circuitry performance, which is particularly beneficial in precision applications.

Figure 1A:
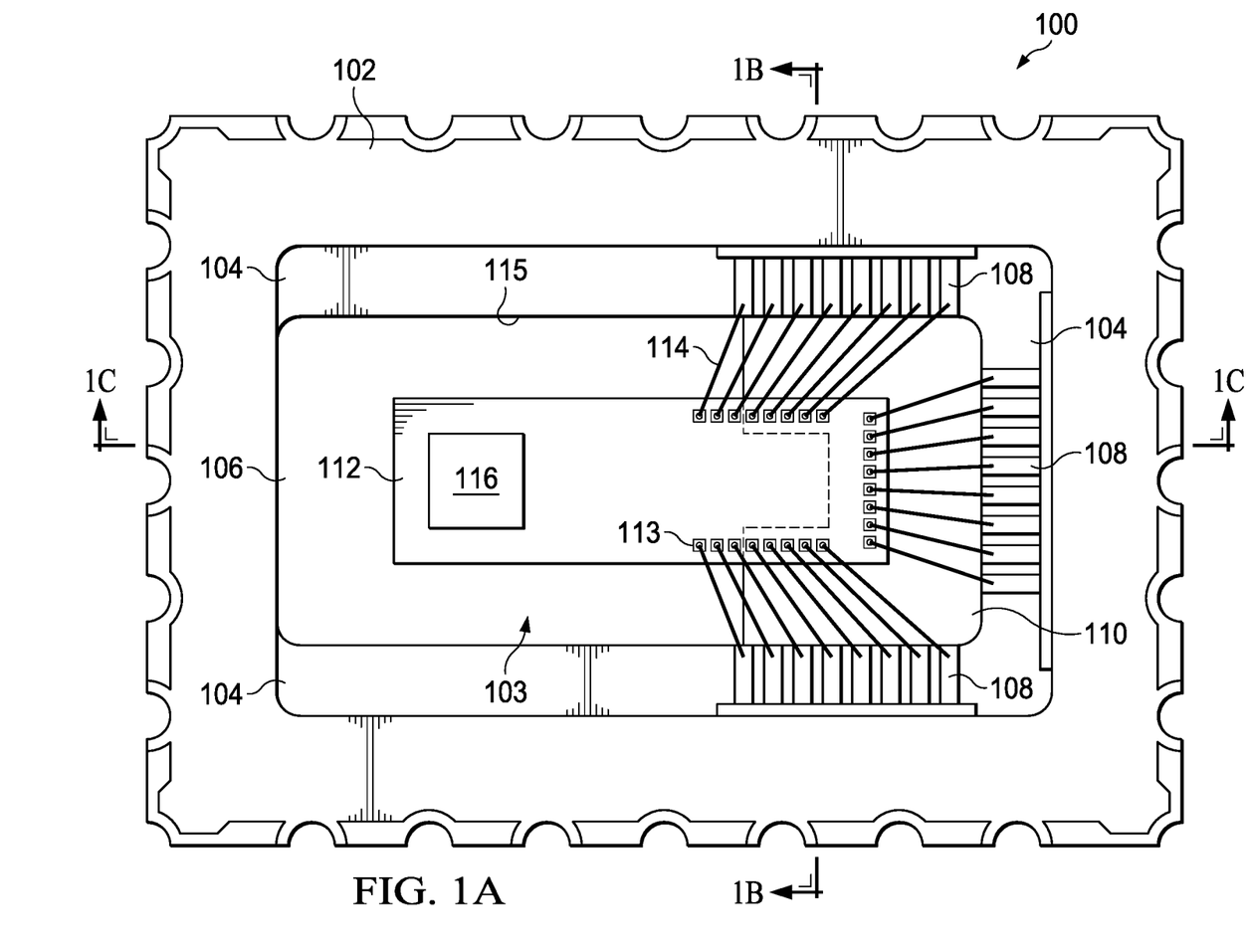
FIG. 1A is a top-down view of a ceramic package having a cantilevered die, in accordance with various examples.

FIG. 1A is a top-down view of a ceramic package 100 having a cantilevered die, in accordance with various examples. In examples, the package 100 is a hermetically-sealable package that is useful in a variety of applications, including military and space applications. The package 100 includes a ceramic substrate 102. The ceramic substrate 102 includes a cavity 103, and the cavity 103 includes an elevated platform 104 and a floor 106. The elevated platform 104 may be in a different horizontal plane relative to the floor 106. The elevated platform 104 may include conductive terminals 108 that are exposed to the cavity 103, meaning that the conductive terminals 108 are physically accessible from within the cavity 103. Although not expressly shown, the conductive terminals 108 may couple to metal layers and vias within the body of the ceramic substrate 102 to establish electrical connections with conductive terminals, such as castellations, on exterior surfaces of the package 100. In this way, electrical pathways are established between the cavity 103 and the exterior of the package 100 so a semiconductor die within the cavity 103 may communicate with other electronic devices outside the package 100.

The package 100 may include a die pad 110 in the cavity 103. In some examples, the die pad 110 abuts the floor 106. In some examples, the die pad 110 includes three members coupled to each other, two of which are parallel to each other, and one of which is perpendicular to the other two members. A semiconductor die 112 may be coupled to the die pad 110 (for example, with a die attach layer such as glue).

The semiconductor die 112 includes a device side in which one or more circuits are formed, and a non-device side opposing the device side. Bond pads 113 are formed on the device side of the semiconductor die 112. Bond wires 114 are coupled to the bond pads 113 and to the conductive terminals 108. The bond wires 114 provide data and/or power between the circuitry in the device side of the semiconductor die 112 and conductive terminals on an exterior of the package 100, such as the castellations described above. The cavity 103 has walls 115, and the semiconductor die 112 is separated from a closest wall 115 by a distance ranging from 0.3 mm to 0.8 mm, with a distance greater than this range resulting in an unacceptably large package size, and with a distance lesser than this range resulting in unacceptable degrees of mechanical and thermal influence on circuitry (e.g., precision circuitry) on the semiconductor die 112. The semiconductor die 112 has a length ranging from 3.5 mm to 4.0 mm, with a length greater than this range resulting in an unacceptably large package size, and a length shorter than this range resulting in an unacceptable degree of mechanical and thermal influence on circuitry (e.g., precision circuitry) formed in the semiconductor die 112.

The semiconductor die 112 is coupled to and mechanically supported by the die pad 110, but, in examples, is not mechanically supported by another structure, meaning that the die pad 110 cantilevers the semiconductor die 112 over the floor 106 of the cavity 103. A precision circuit 116, such as a reference voltage supply, is formed in the device side of the semiconductor die 112. Accordingly, the semiconductor die 112 suspends the precision circuit 116 over the floor 106 of the cavity 103. In examples, the precision circuit 116 is located in a segment of the semiconductor die 112 that is distal to the die pad 110. The precision circuit 116 (e.g., an edge of the precision circuit 116 closest to the die pad 110) is located a distance from the die pad 110 (e.g., a point on the die pad 110 closest to the precision circuit 116) that is at least 1.5 mm, with a greater distance resulting in an unacceptably large package size, and with a lesser distance resulting in unacceptable degrees of mechanical and thermal influence via the die pad 110. A distance ranging between 0.25 mm and 0.5 mm separates the semiconductor die 112 from the floor 106, with a distance below this range being disadvantageous because it provides inadequate mechanical and thermal isolation, and with a distance above this range being disadvantageous because it results in an unacceptably large package size. A distance ranging between 0.25 mm and 0.5 mm separates the precision circuit 116 from the floor 106, with a distance below this range being disadvantageous because it provides inadequate mechanical and thermal isolation, and with a distance above this range being disadvantageous because it results in an unacceptably large package size. Because the precision circuit 116 is suspended over the floor 106, and because the precision circuit 116 is located in a segment of the semiconductor die 112 that is distal to the die pad 110, and further because the cavity 103 is later hermetically sealed to form a vacuum, the precision circuit 116 is significantly isolated from mechanical and thermal variations. Consequently, operations of the precision circuit 116 are not significantly affected by mechanical and thermal influences.

A ceramic material of the ceramic substrate 102 may be selected to further protect the precision circuit 116 from mechanical and thermal influences. The ceramic in the ceramic substrate 102 has a thermal conductivity less than 5.0 Watts per meters Kelvin (W/mK), with a thermal conductivity outside this range being disadvantageous because it increases thermal conductivity to the point that a heating element provided in the system is unable to maintain a constant temperature for the semiconductor die 112 (e.g., for the precision circuit 116).

In some examples, conductive pathways including the bond pads 113, bond wires 114, conductive terminals 108, conductive traces and/or metal layers and/or vias within the ceramic substrate 102, and conductive terminals (e.g., castellations) on exterior surfaces of the package 100 are composed of a common metal, such as copper, gold, or aluminum. Conductive pathways composed of a common metal mitigate or eliminate the thermocouple effect that is otherwise present when a device or system has two different metals in the presence of a thermal gradient.

Figure 1B:
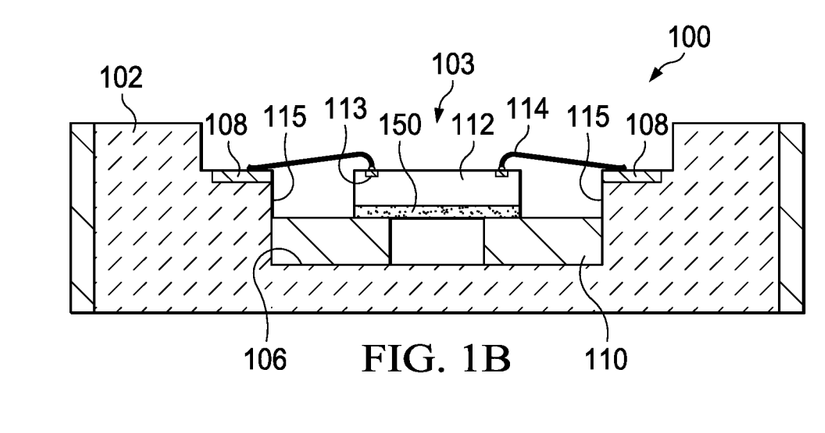
FIG. 1B is a profile cross-sectional view of a ceramic package having a cantilevered die, in accordance with various examples.

FIG. 1B is a profile cross-sectional view of the package 100, in accordance with various examples. FIG. 1B shows a die attach layer 150 that couples the non-device side of the semiconductor die 112 to the die pad 110. In examples, the die attach layer 150 is non-conductive and has a low thermal conductivity to prevent heat transfer between the semiconductor die 112 and the die pad 110. In examples, the die attach layer 150 covers at least a majority of the non-device side of the semiconductor die 112. In examples, the die attach layer 150 covers the portion of the non-device side of the semiconductor die 112 that is aligned with the die pad 110.

Figure 1C:
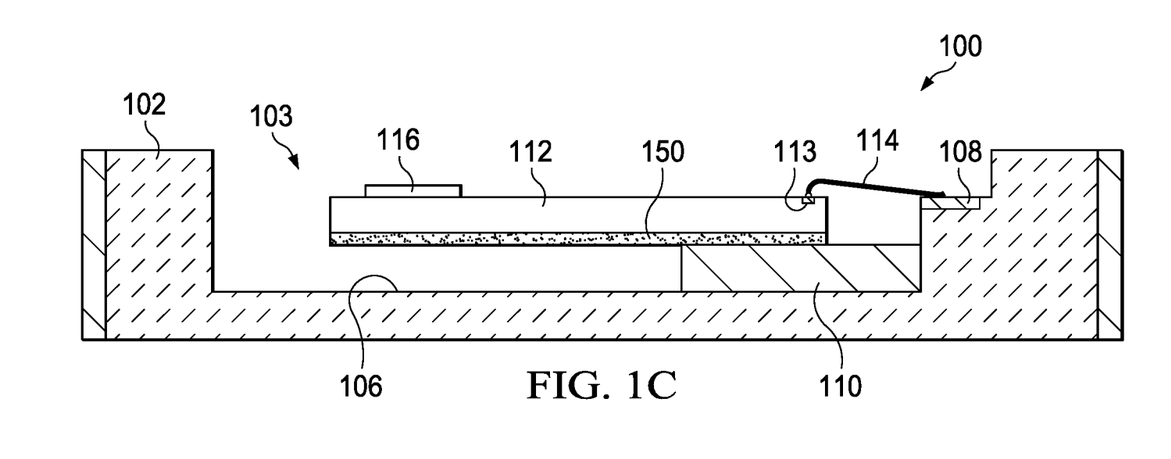
FIG. 1C is a profile cross-sectional view of a ceramic package having a cantilevered die, in accordance with various examples.
Figure 1D:
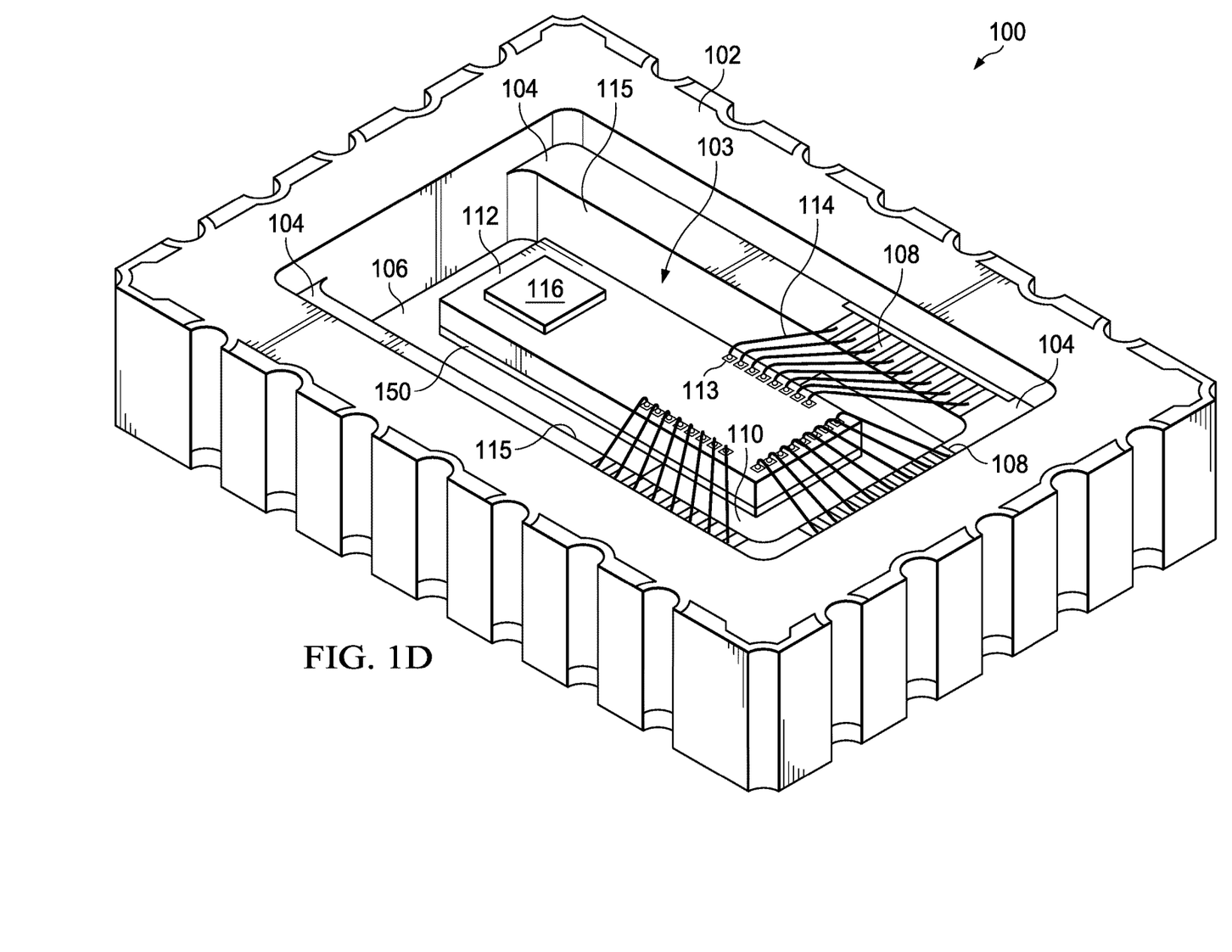
FIG. 1D is a perspective view of a ceramic package having a cantilevered die, in accordance with various examples.

FIG. 1C is a profile cross-sectional view of the package 100, in accordance with various examples. As described herein, an aim of the structures described herein is to mitigate thermal effects on the precision circuit 116. Stated another way, an aim of the structures described herein is to achieve maximal thermal resistance between the precision circuit 116 to an exterior of the package 100. Referring to FIG. 1C, this aim may be achieved at least in part by implementing the thinnest possible semiconductor die 112 (the longer and thinner the semiconductor die 112, the lower the resonant frequency, with a resonant frequency outside the audible range (greater than 20 kiloHertz (kHz)) being useful to avoid the negative impacts on functional integrity caused by ambient noise in the audible range). The aim also may be achieved by increasing the thermal resistance of the die attach layer 150, decreasing the surface area (e.g., contact area) through which heat flows from the semiconductor die 112 into the remainder of the package 100, increasing the thermal resistance of the ceramic substrate 102, closing the package 100 with a vacuum-sealed lid, positioning the precision circuit 116 as far as possible from the edges of the semiconductor die 112, and increasing the distance between the precision circuit 116 and the die pad 110. In examples, a distance between an end of the semiconductor die 112 distal to the die pad 110 and an edge of the precision circuit 116 closest to that distal end of the semiconductor die 112 ranges between 0.2 millimeters and 0.4 millimeters. FIG. 1D is a perspective view of the package 100, in accordance with various examples.

In some examples, the semiconductor die 112 includes a heating element (not expressly shown) that may be controlled by a temperature control feedback loop. The heating element is configured to maintain the precision circuit 116 at a constant temperature, or within a specific range from the constant temperature. By implementing structures with a goal of achieving maximal thermal resistance between the precision circuit 116 and the exterior of the package 100 as described above, the energy consumed by the heating element is mitigated. In examples, the constant temperature described above is higher than the ambient temperature of the package 100 so the temperature of the precision circuit 116 can more easily be controlled. In examples, the heating element is configured to counteract the thermal gradient of the semiconductor die 112 (e.g., by directing thermal energy where heat flow is greatest).

Figure 2A:
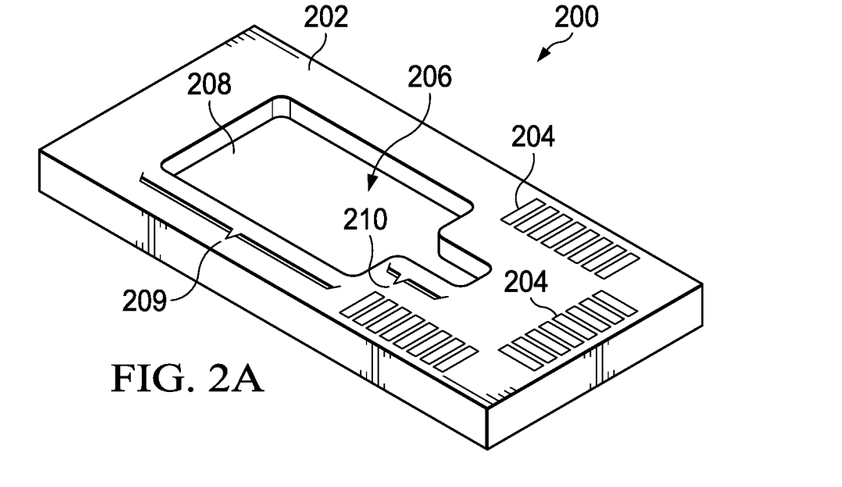
FIG. 2A is a perspective view of a non-conductive member adapted to be coupled to a cantilevered die and a ceramic package, in accordance with various examples.

FIG. 2A is a perspective view of a non-conductive member 200 adapted to be coupled to a cantilevered die and a ceramic package, in accordance with various examples. The non-conductive member 200 may be formed of any suitable non-conductive material, such as ceramic. The non-conductive member 200 includes a body 202 and conductive terminals 204 formed on a top surface of the body 202. The body 202 includes a cavity 206 having a floor 208, a wide portion 209, and a narrow portion 210. As described below, the portion of the top surface of the body 202 that circumscribes the narrow portion 210 may support a semiconductor die so the semiconductor die is cantilevered over the segment of the floor 208 that is in the wide portion 209.

Figure 2B:
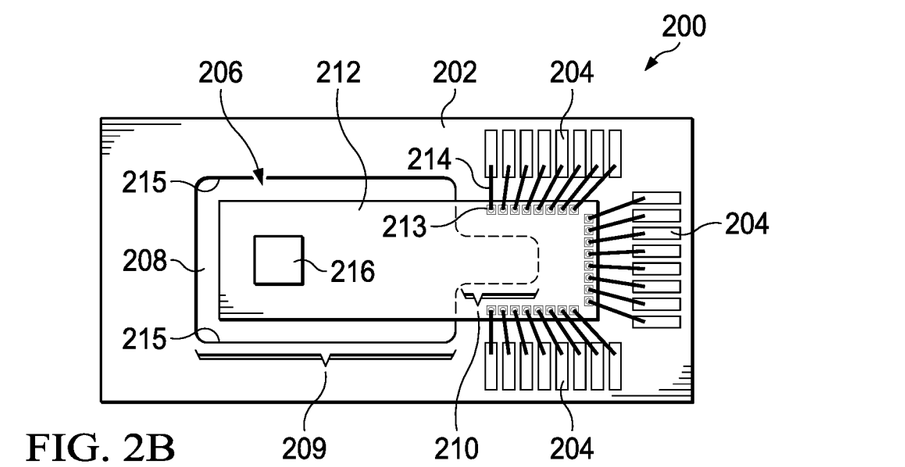
FIG. 2B is a top-down view of a non-conductive member adapted to be coupled to a cantilevered die and a ceramic package, in accordance with various examples.

FIG. 2B is a top-down view of the non-conductive member 200 coupled to a semiconductor die 212. Specifically, the semiconductor die 212 may be coupled to a portion of the top surface of the body 202 that circumscribes the narrow portion 210. A distance ranging between 0.25 mm and 0.5 mm separates the semiconductor die 212 from the floor 208, with a distance below this range being disadvantageous because it provides inadequate mechanical and thermal isolation, and with a distance above this range being disadvantageous because it results in an unacceptably large package size.

Bond pads 213 on a device side of the semiconductor die 212 are coupled to conductive terminals 204 by way of bond wires 214. The cavity 206 has walls 215, and the semiconductor die 212 is separated from a closest wall 215 by a distance ranging from 0.25 millimeters (mm) to 0.5 mm, with a distance greater than this range resulting in an unacceptably large package size, and with a distance lesser than this range resulting in unacceptable degrees of mechanical and thermal influence on circuitry (e.g., precision circuitry) on the semiconductor die 212. A precision circuit 216, such as a reference voltage supply, is formed on the device side of the semiconductor die 212, and, more specifically, on a segment of the semiconductor die 212 that is distal to the narrow portion 210. In this manner, the semiconductor die 212 is cantilevered over the floor 208 of the cavity 206. The precision circuit 216 is separated from a closest wall 215 by a distance ranging from 0.25 mm to 0.5 mm, with a distance greater than this range resulting in an unacceptably large package size, and with a distance lesser than this range resulting in unacceptable degrees of mechanical and thermal influence on circuitry (e.g., precision circuitry) on the semiconductor die 212. Accordingly, the precision circuit 216 is suspended over the floor 208, and, like the precision circuit 116 described above with reference to FIGS. 1A-1D, is protected from deleterious mechanical and thermal influences. The precision circuit 216 is positioned a distance from the portion of the top surface of the body 202 that is coupled to the semiconductor die 212, with this distance ranging from 0.25 mm to 0.5 mm. A distance greater than this range is disadvantageous because it results in an unacceptably large package size, and a distance lesser than this range is disadvantageous because it results in an unacceptable degree of thermal and mechanical influence on the precision circuit 216. The semiconductor die 212 has a length ranging from 0.25 mm to 0.5 mm, with a length greater than this range resulting in an unacceptably large package size, and a length shorter than this range resulting in an unacceptable degree of mechanical and thermal influence on circuitry (e.g., precision circuit 216) formed in the semiconductor die 212. A distance ranging between 0.25 mm and 0.5 mm separates the precision circuit 216 from the floor 208, with a distance below this range being disadvantageous because it provides inadequate mechanical and thermal isolation, and with a distance above this range being disadvantageous because it results in an unacceptably large package size. In some examples, a ceramic in the body 202 has a thermal conductivity less than 5.0 Watts per meters Kelvin (W/mK), with a thermal conductivity outside this range being disadvantageous because it causes unacceptable levels of energy inefficiency and poor temperature control.

Figure 2C:
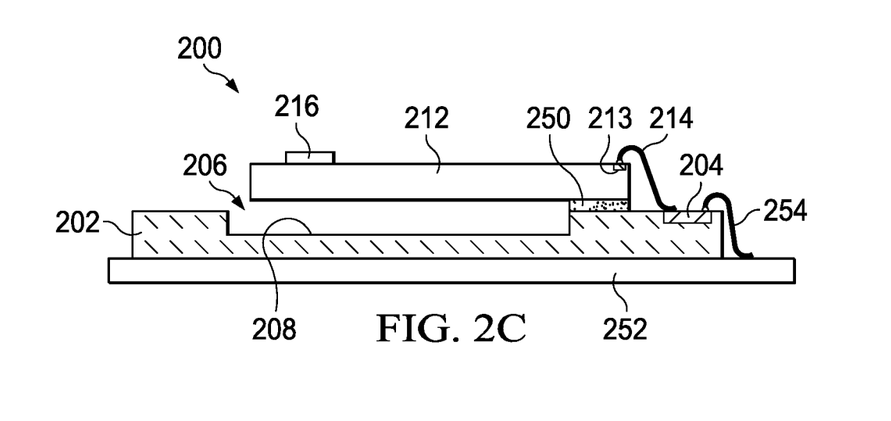
FIG. 2C is a profile cross-sectional view of a non-conductive member adapted to be coupled to a cantilevered die and a ceramic package, in accordance with various examples.

FIG. 2C is a profile cross-sectional view of the non-conductive member 200 coupled to a printed circuit board (PCB), in accordance with various examples. The semiconductor die 212 is coupled to the body 202 by way of a die attach layer 250. The conductive terminals 204 are coupled to a PCB 252 by way of bond wires 254. For example, the bond wires 254 may be coupled to conductive traces (not shown in FIG. 2C) on the PCB 252. In some examples, the PCB 252 is a test board, and in some such examples, the length of the PCB 252 may be extended to accommodate conductive terminals on the PCB 252 to which electronic testing equipment may be coupled. In some examples, the PCB 252 is a system PCB that is included in an electronic device.

Figure 2D:
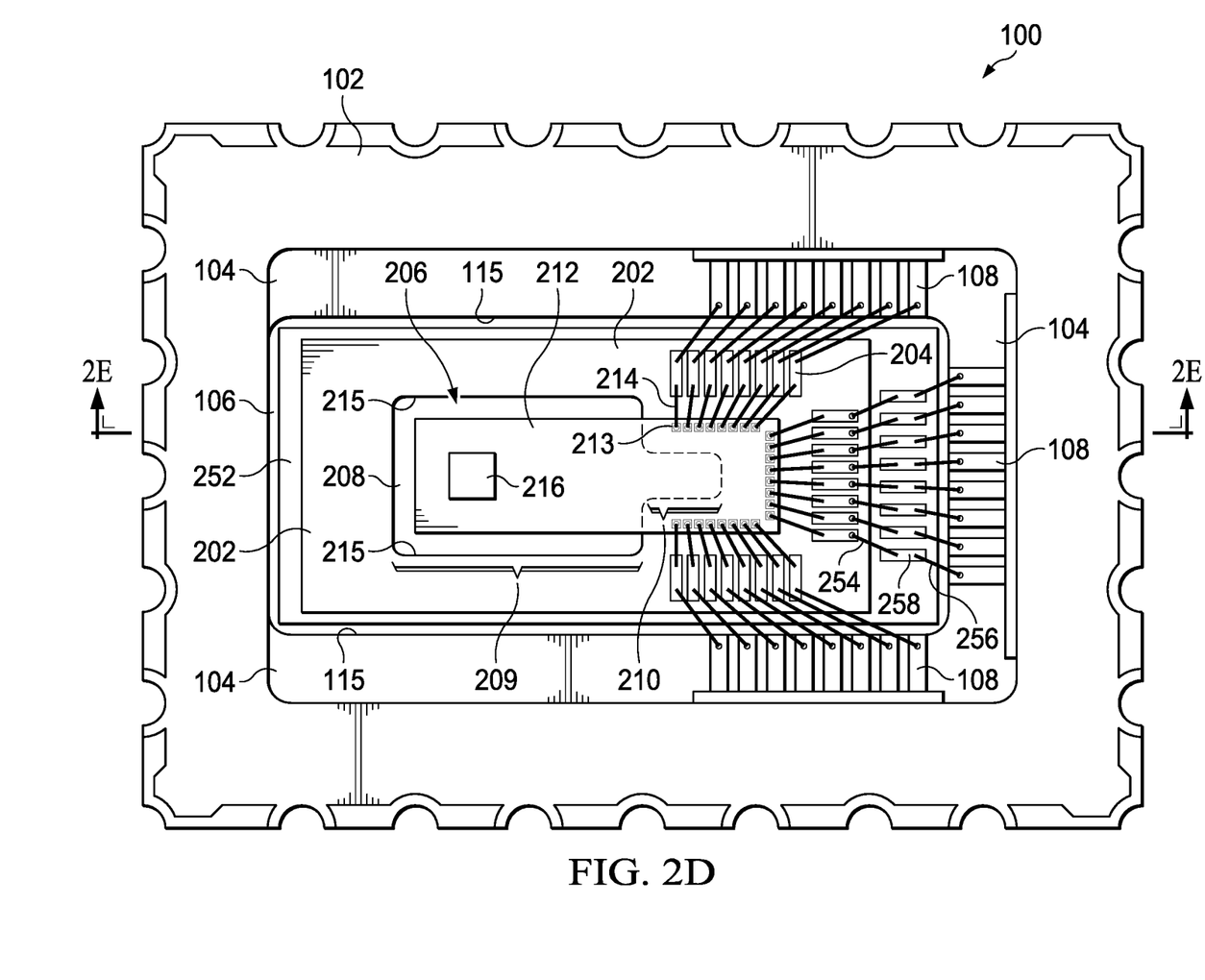
FIG. 2D is a top-down view of a ceramic package having a non-conductive member coupled to a cantilevered die, in accordance with various examples.
Figure 2E:
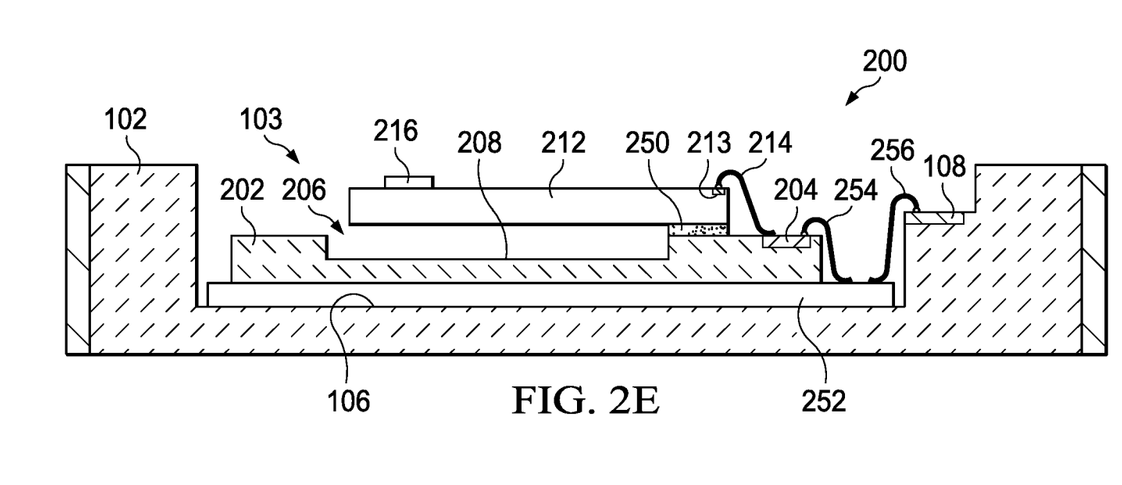
FIG. 2E is a profile cross-sectional view of a ceramic package having a non-conductive member coupled to a cantilevered die, in accordance with various examples.
Figure 2F:
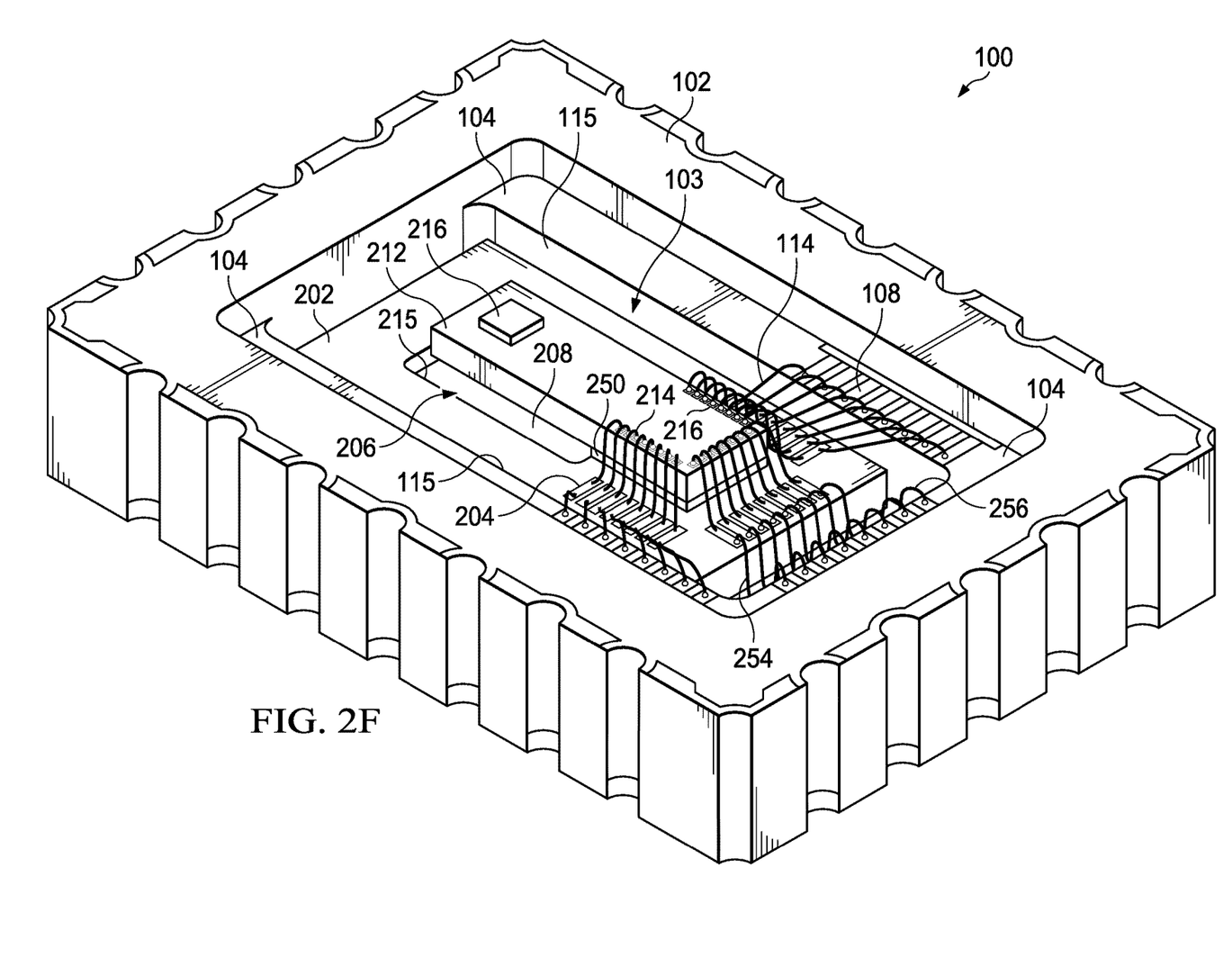
FIG. 2F is a perspective view of a ceramic package having a non-conductive member coupled to a cantilevered die, in accordance with various examples.

As shown in FIG. 2D, the structure shown in FIG. 2C may be positioned in a cavity of a ceramic package, such as on the floor 106 of the cavity 103 of package 100 in which the die pad 110 and semiconductor die 112 have been removed (FIGS. 1A-1D). Bond wires 256 may couple conductive traces 258 on the PCB 252 to conductive terminals 108 (FIG. 1A). In this manner, conductive pathways are established from the semiconductor die 212, to the bond wires 214, to the conductive terminals 204, to the bond wires 254, to conductive traces 258 on the PCB 252, to the bond wires 256, to the conductive terminals 108, through a network of metal layers and/or vias in the body of the ceramic substrate 102, to conductive terminals (e.g., castellations) on an exterior surface of the package 100. In some examples, the conductive pathway is formed of a common metal, such as copper, to mitigate or eliminate the thermocouple effect described above. Accordingly, electrical communications are facilitated between the semiconductor die 212 and electronic devices outside the package 100. Because the package 100 is hermetically sealed, because the precision circuit 216 is suspended over the floor 208, and because the precision circuit 216 is positioned distal to the portion of the body 202 that mechanically supports the semiconductor die 212 (FIG. 2B), the precision circuit 216 is protected from deleterious mechanical and thermal influences. FIG. 2E is a profile cross-sectional view of the structure of FIG. 2D, in accordance with various examples. FIG. 2F is a perspective view of the structure of FIG. 2D, in accordance with various examples.

Figures 3A, 3B:
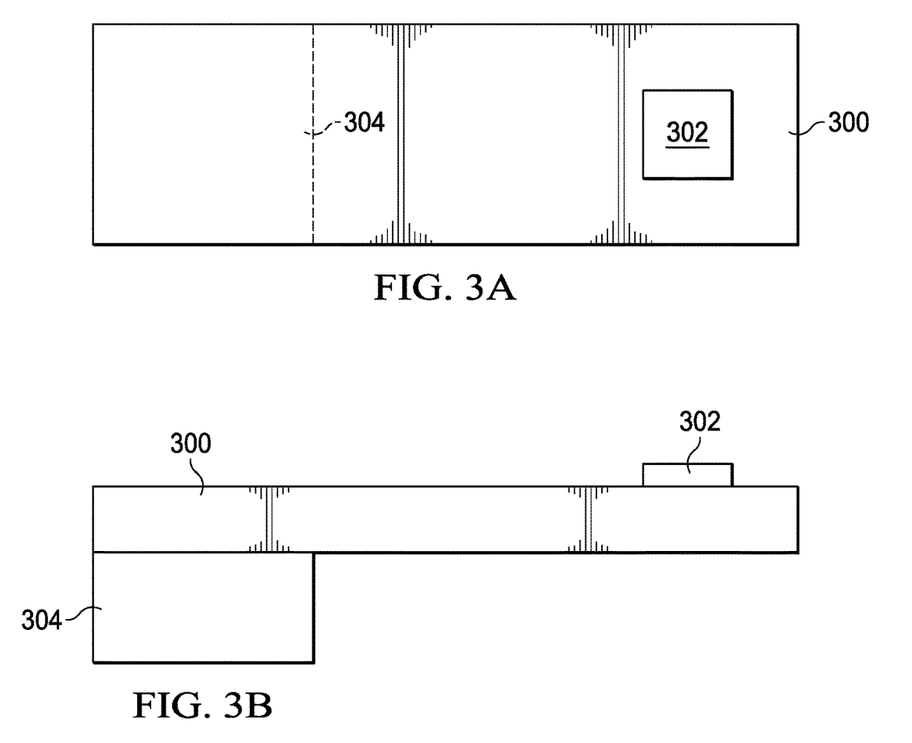
FIG. 3A is a top-down view of a die pad coupled to a cantilevered die, in accordance with various examples.
FIG. 3B is a profile cross-sectional view of a die pad coupled to a cantilevered die, in accordance with various examples.
Figure 3C:
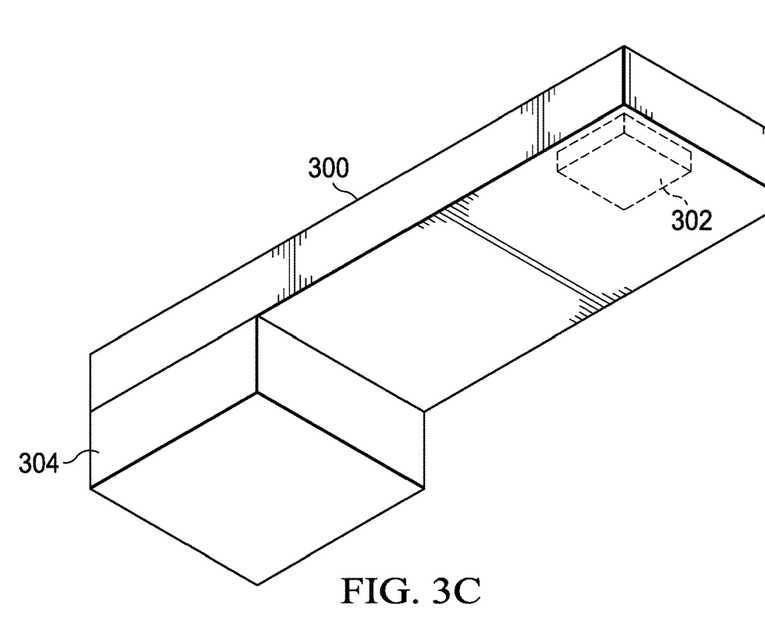
FIG. 3C is a perspective view of a die pad coupled to a cantilevered die, in accordance with various examples.

As described above with reference to FIGS. 1A-1D, a die pad is useful to mechanically support and suspend a semiconductor die over a package cavity. Different die pad structures are contemplated and included in the scope of this description, with each die pad transferring different degrees of mechanical and thermal energy to the semiconductor die to which the die pad is coupled and, therefore, to the precision circuit formed in the semiconductor die. FIG. 3A is a top-down view of a semiconductor die 300 having a precision circuit 302 formed therein. The semiconductor die 300 is coupled to a die pad 304. The die pad 304 is configured to mechanically support the semiconductor die 300 by cantilevering the semiconductor die 300 over a package cavity, as described above. The die pad 304 is a monolithic, contiguous block, meaning that the die pad 304 is not divided into multiple, discrete portions. The die pad 304 may be of any suitable shape or size. FIG. 3B is a profile cross-sectional view of the structure of FIG. 3A. FIG. 3C is a perspective view of the structure of FIG. 3A.

Figure 4A:
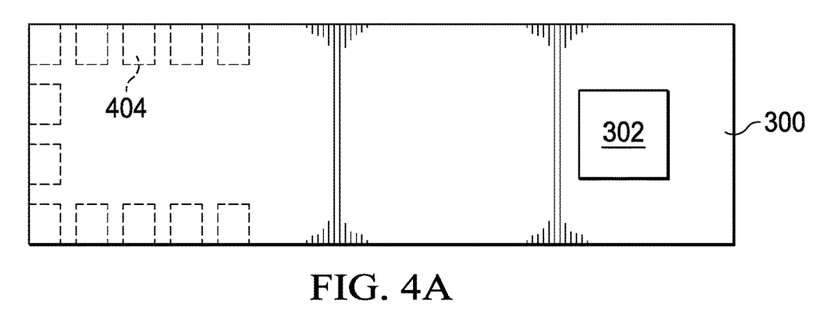
FIG. 4A is a top-down view of a die pad coupled to a cantilevered die, in accordance with various examples.
Figure 4B:
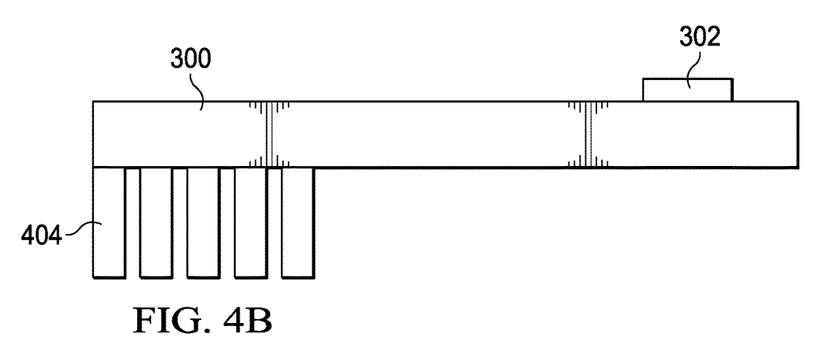
FIG. 4B is a profile cross-sectional view of a die pad coupled to a cantilevered die, in accordance with various examples.
Figure 4C:
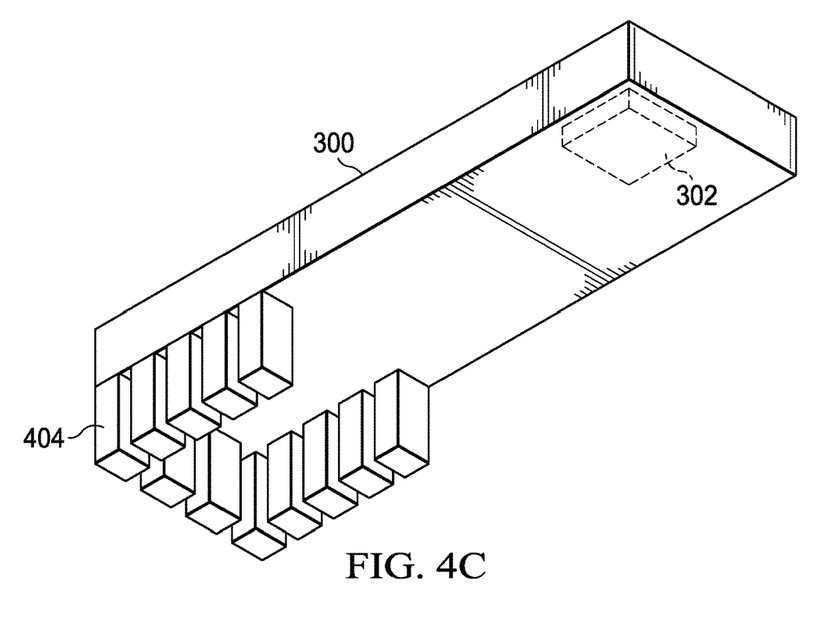
FIG. 4C is a perspective view of a die pad coupled to a cantilevered die, in accordance with various examples.

FIG. 4A is a top-down view of the semiconductor die 300 having a precision circuit 302 formed therein. The semiconductor die 300 is coupled to a die pad 404. The die pad 404 is configured to mechanically support the semiconductor die 300 by cantilevering the semiconductor die 300 over a package cavity, as described above. The die pad 404 includes multiple discrete members separated by gaps. In some examples, the discrete members of the die pad 404 are rectangular, although the discrete members of the die pad 404 may be of any suitable shape and size. In examples, the discrete members of the die pad 404 are arranged in three linear arrays, with two of the linear arrays being parallel to each other and extending along at least part of a length of the semiconductor die 300, and with one of the liner arrays being perpendicular to the remaining two linear arrays, thus forming a "U" shape. FIG. 4B is a profile cross-sectional view of the structure of FIG. 4A. FIG. 4C is a perspective view of the structure of FIG. 4A.

Figure 4D:
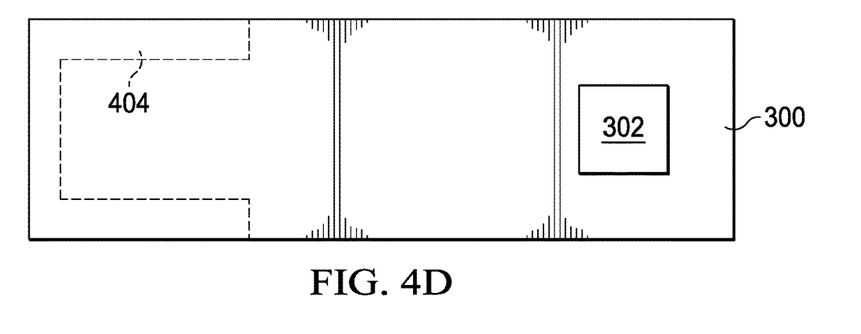
FIG. 4D is a top-down view of a die pad coupled to a cantilevered die, in accordance with various examples.
Figure 4E:
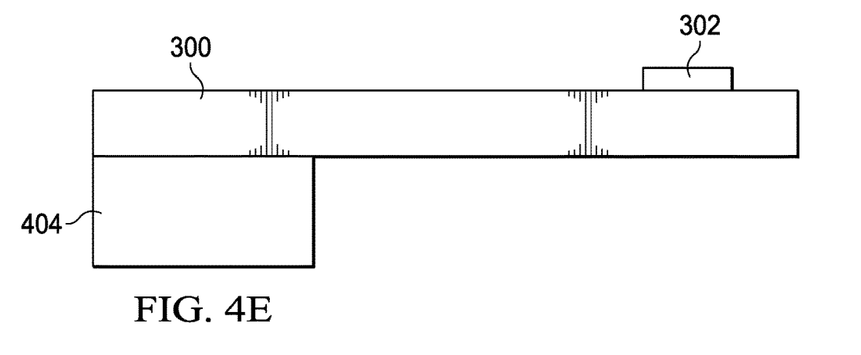
FIG. 4E is a profile cross-sectional view of a die pad coupled to a cantilevered die, in accordance with various examples.
Figure 4F:
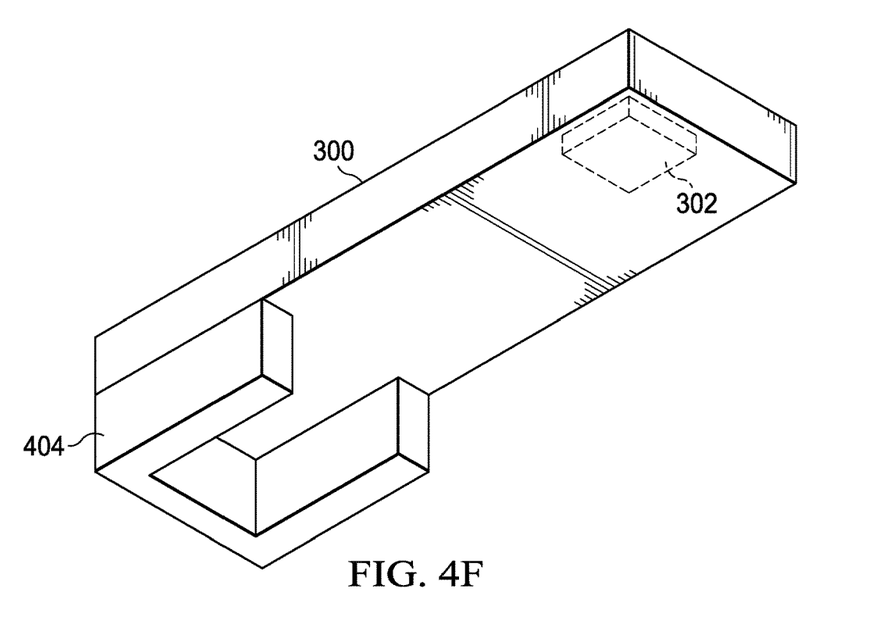
FIG. 4F is a perspective view of a die pad coupled to a cantilevered die, in accordance with various examples.

FIG. 4D is a top-down view of the semiconductor die 300 having a precision circuit 302 formed therein. The semiconductor die 300 is coupled to a die pad 404. The die pad 404 is configured to mechanically support the semiconductor die 300 by cantilevering the semiconductor die 300 over a package cavity, as described above. The die pad 404 includes a single, "U"-shaped monolithic member, as shown. FIG. 4E is a profile cross-sectional view of the structure of FIG. 4D. FIG. 4F is a perspective view of the structure of FIG. 4D.

Figure 5A:
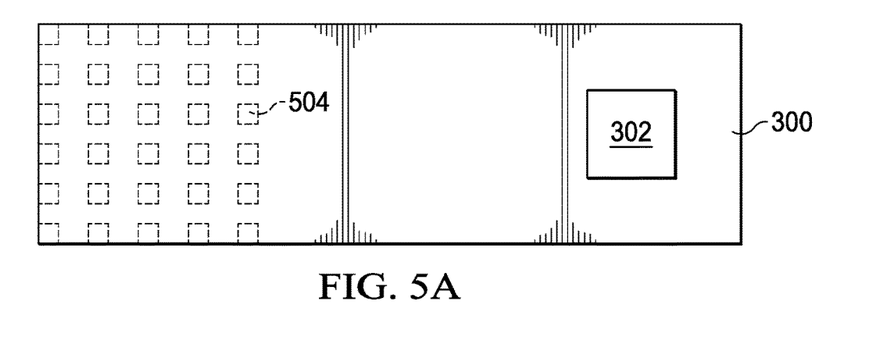
FIG. 5A is a top-down view of a die pad coupled to a cantilevered die, in accordance with various examples.
Figure 5B:
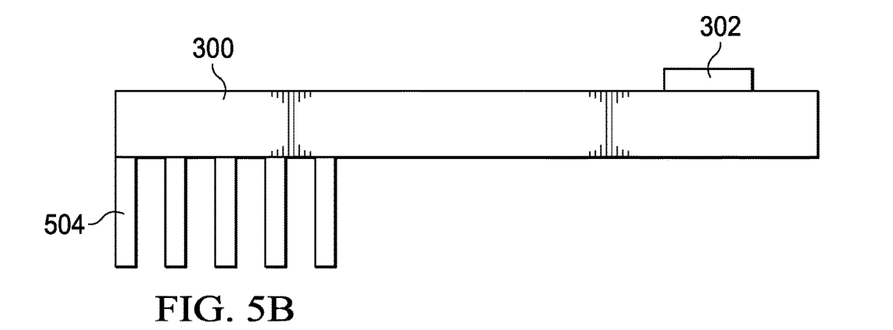
FIG. 5B is a profile cross-sectional view of a die pad coupled to a cantilevered die, in accordance with various examples.
Figures 5C, 7:
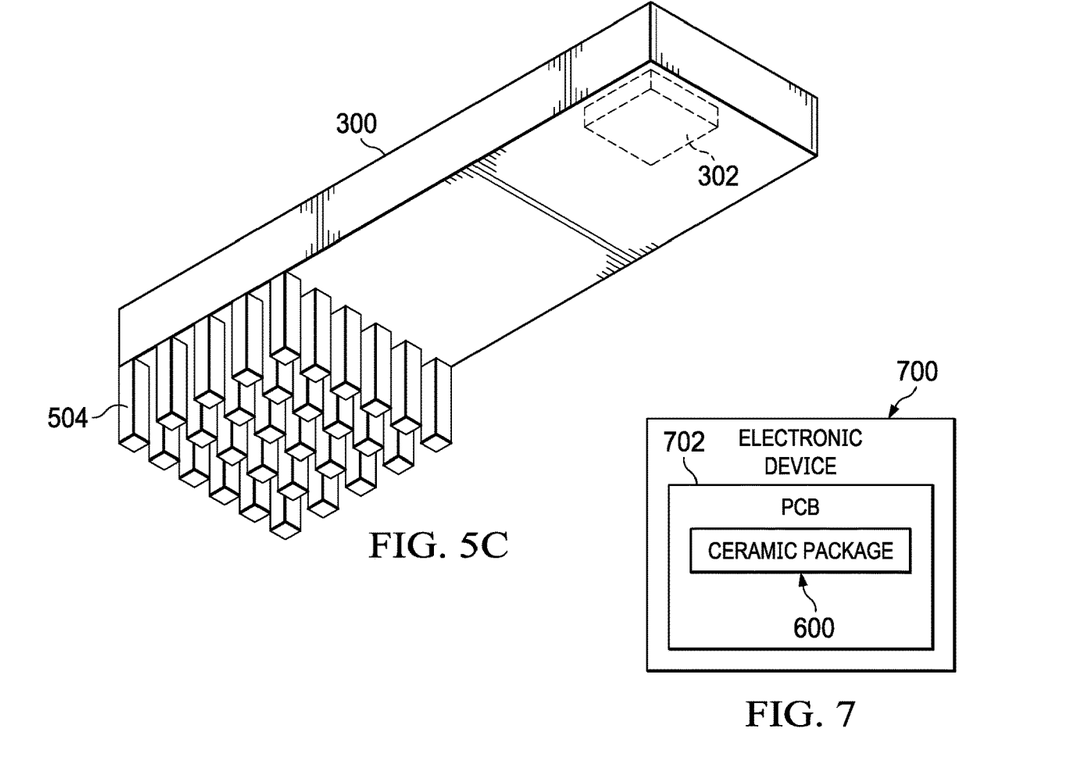
FIG. 5C is a perspective view of a die pad coupled to a cantilevered die, in accordance with various examples.
FIG. 7 is a block diagram of an electronic device having a hermetically sealed ceramic package containing a cantilevered die, in accordance with various examples.

FIG. 5A is a top-down view of a semiconductor die 300 having a precision circuit 302 formed therein. The semiconductor die 300 is coupled to a die pad 504. The die pad 504 is configured to mechanically support the semiconductor die 300 by cantilevering the semiconductor die 300 over a package cavity, as described above. The die pad 504 is a matrix having multiple discrete members separated by gaps. In some examples, the discrete members of the die pad 504 are rectangular, although the discrete members of the die pad 504 may be of any suitable shape. In examples, the discrete members of the die pad 504 are arranged in a matrix having multiple rows and columns, with any suitable number of rows and/or columns being useful. FIG. 5B is a profile cross-sectional view of the structure of FIG. 5A. FIG. 5C is a perspective view of the structure of FIG. 5A.

Figure 6:
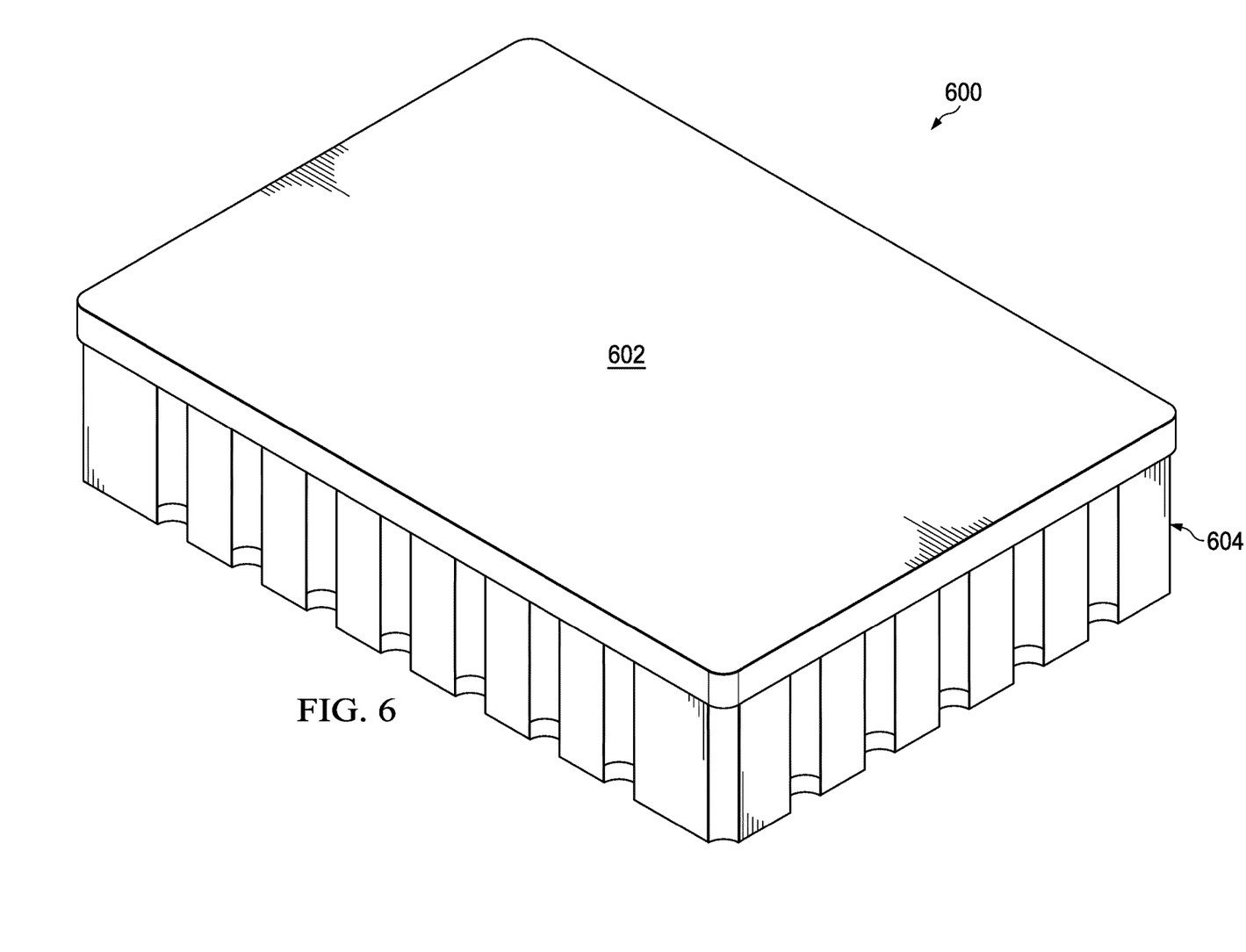
FIG. 6 is a perspective view of a hermetically sealed ceramic package containing a cantilevered die and having a lid covering the cantilevered die, in accordance with various examples.

FIG. 6 is a perspective view of a ceramic package 600 containing a semiconductor die cantilevered over a cavity, as described above. The package 600 includes a lid 602 covering the cavity and the cantilevered semiconductor die, in accordance with various examples. A ceramic substrate 604 may include the structures shown in any of the examples described above.

FIG. 7 is a block diagram of an electronic device having a hermetically sealed ceramic package containing a cantilevered die, in accordance with various examples. In particular, an electronic device 700 includes a PCB 702 and the hermetically sealed ceramic package 600 coupled to the PCB 702. The ceramic package 600 includes a cantilevered die as described above. The electronic device 700 may include a personal electronic device (e.g., smartphones, laptop computers, desktop computers, tablets, notebooks, artificial intelligence assistants), an electronic appliance (e.g., refrigerators, microwave ovens, toaster ovens, dishwashers), a networking or enterprise-level electronic device or system (e.g., servers, routers, modems, mainframe computers, wireless access points), an automobile or aviation device or system (e.g., control panels, entertainment devices, navigation devices, power electronics), or any of a variety of other electronic devices or systems. The structures described herein may be implemented in specific types of devices, such as Hall effect sensors. More generally, the structures described herein may be useful in the context of any application in which one or more of mechanical stress, mechanical stress gradients, thermal coefficients, and thermal gradients can affect the performance and functional integrity of that application.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitor, respectively, coupled in parallel between the same nodes. For example, a resistor or capacitor shown and described herein as a single component may instead be multiple resistors or capacitor, respectively, coupled in series between the same two nodes as the single resistor or capacitor.

Unless otherwise stated, "about," "approximately," or "substantially" preceding a value means+/−10 percent of the stated value. Unless otherwise stated, two objects described as being "parallel" are side by side and have a distance between them that is constant or varies by no more than 10 percent. Unless otherwise stated, two objects described as being perpendicular intersect at an angle ranging from 80 degrees to 100 degrees. Modifications are possible in the described examples, and other examples are possible within the scope of the claims.

What is claimed is:

1. A device, comprising:
    a non-conductive substrate having a cavity, a surface of the non-conductive substrate forming a floor of the cavity;
    a die pad in the cavity;
    a semiconductor die in the cavity and having a first segment coupled to the die pad and a second segment suspended over and facing the floor of the cavity;
    a first conductive member in the cavity, the first conductive member coupled to a second conductive member exposed to an exterior of the non-conductive substrate; and
    a bond wire coupled to a device side of the semiconductor die and to the first conductive member.

2. The device of claim 1, further comprising a glue layer coupled to a surface of the semiconductor die and to the die pad.

3. The device of claim 1, wherein the die pad abuts the floor of the cavity.

4. The device of claim 1, wherein the die pad has first, second, and third members, the first and second members parallel to each other, the third member coupled between the first and second members, the third member perpendicular to the first and second members.

5. The device of claim 4, wherein the semiconductor die is coupled to the first, second, and third members.

6. The device of claim 1, wherein a distance between an end of the second segment distal to the die pad and an edge of a circuit formed on the device side of the semiconductor die ranges between 0.2 millimeters and 0.4 millimeters.

7. The device of claim 1, wherein the semiconductor die has a length ranging from 3.5 millimeters to 4.0 millimeters.

8. The device of claim 1, wherein the die pad is a single, monolithic component.

9. The device of claim 1, wherein the semiconductor die and the floor of the cavity are separated by a distance ranging from 0.25 millimeters to 0.5 millimeters.

10. The device of claim 1, wherein the second segment is separated from a closest wall of the cavity by a distance ranging from 0.3 millimeters to 0.8 millimeters.

11. The device of claim 1, wherein a smallest distance between the die pad and a circuit formed on the device side of the semiconductor die is at least 1.5 millimeters.

12. The device of claim 1, wherein the non-conductive substrate includes a ceramic substrate.

13. The device of claim 1, wherein the surface is a first surface, and the non-conductive substrate includes:
    a first ceramic substrate, in which the first conductive member is on a second surface of the first ceramic substrate;
    a non-conductive substrate on the first ceramic substrate;
    a third conductive member on the non-conductive substrate;
    a second ceramic substrate on the non-conductive substrate, in which the second ceramic substrate includes the first surface forming the floor of the cavity.

14. The device of claim 13, further comprising bond wires coupled between the semiconductor die and the third conductive member and between the third conductive member and the first conductive member.

15. A device, comprising:
    a non-conductive substrate having a cavity, a surface of the non-conductive substrate forming a floor of the cavity;
    a die pad on the floor of the cavity; and
    a semiconductor die having first and second segments, the first segment coupled to the die pad, the second segment suspended over the floor of the cavity and facing the surface, the semiconductor die having a circuit formed therein, the circuit positioned on the second segment.

16. The device of claim 15, wherein the non-conductive substrate includes a ceramic substrate having a thermal conductivity less than 5.0 Watts per meters Kelvin.

17. The device of claim 15, wherein the device includes:
    a copper bond pad on the semiconductor die;
    a copper bond wire coupled to the copper bond pad;
    a first copper member in the cavity coupled to the copper bond wire;
    a copper trace in the non-conductive substrate, the copper trace coupled to the first copper member; and
    a second copper member exposed to an exterior of the non-conductive substrate, the second copper member coupled to the copper trace.

18. The device of claim 15, wherein the die pad is a single, monolithic component.

19. The device of claim 15, wherein the semiconductor die and the floor of the cavity are separated by a distance ranging from 0.25 millimeters to 0.5 millimeters.

20. The device of claim 15, wherein the die pad includes multiple discrete members, the multiple discrete members separated from each other by gaps.

21. The device of claim 15, wherein the die pad includes linear arrays of multiple discrete members, the multiple discrete members in the linear arrays separated from each other by gaps.

22. The device of claim 15, wherein the die pad includes multiple discrete members arranged in one or more arrays.

23. A device, comprising:
   a first substrate having a first cavity, the first substrate being non-conductive;
   a first conductive member in the first cavity;
   a second substrate on a floor of the first cavity;
   a first circuit on the second substrate;
   a third substrate on the second substrate, the third substrate being non-conductive and having a second cavity;
   a second conductive member on a surface of the third substrate;
   a semiconductor die coupled to the surface of the third substrate and suspended over the second cavity, the semiconductor die having a second circuit positioned on a portion of the semiconductor die;
   a first bond wire coupled between the semiconductor die and the second conductive member;
   a second bond wire coupled between the second conductive member and the first circuit; and
   a third bond wire coupled between the second circuit of the second substrate and the first conductive member.

24. The device of claim 23, further comprising a die pad coupled between the semiconductor die and the surface of the third substrate.

25. The device of claim 23, wherein the semiconductor die is separated from a floor of the second cavity by a distance ranging from 0.25 millimeters to 0.5 millimeters.

26. The device of claim 23, wherein the first substrate is a ceramic substrate.

27. The device of claim 23, wherein the second substrate includes a printed circuit board (PCB).

28. The device of claim 23, wherein the third substrate includes a ceramic substrate.

29. The device of claim 23, wherein the second cavity includes first and second portions, the first portion being wider than the second portion, and the second circuit is over the first portion of the second cavity.

30. The device of claim 23, further comprising fourth conductive member on an exterior of the first substrate, and metal traces in the first substrate coupled between the first conductive member and the fourth conductive member.

\* \* \* \* \*